United States Patent
Wilson-Jones et al.

(10) Patent No.: US 6,330,140 B1
(45) Date of Patent: Dec. 11, 2001

(54) METHOD OF AND CIRCUIT FOR TESTING AN ELECTRICAL ACTUATOR DRIVE STAGE

(75) Inventors: Russell Wilson-Jones, Stratford-Upon-Avon; John Michael Ironside, Birmingham, both of (GB)

(73) Assignee: TRW Lucas Varity Electric Steering Limited, West Midlands (GB)

( * ) Notice: Subject to any disclaimer, the term of this patent is extended or adjusted under 35 U.S.C. 154(b) by 0 days.

(21) Appl. No.: 09/126,000

(22) PCT Filed: Feb. 26, 1997

(86) PCT No.: PCT/GB97/00528

§ 371 Date: May 11, 1999

§ 102(e) Date: May 11, 1999

(87) PCT Pub. No.: WO97/32220

PCT Pub. Date: Sep. 4, 1997

(30) Foreign Application Priority Data

Mar. 1, 1996 (GB) .................................................. 9604431

(51) Int. Cl.[7] .............................. H02H 3/18; G01R 31/42
(52) U.S. Cl. ............................ 361/87; 361/93.1; 324/527
(58) Field of Search .................................. 361/18, 20, 23, 361/78, 79, 87, 88, 93.1, 93.2, 93.9; 318/434, 439; 324/500, 512, 527, 522

(56) References Cited

U.S. PATENT DOCUMENTS

| | | | |
|---|---|---|---|
| 3,112,435 | * 11/1963 | Barney | 361/58 |
| 4,523,563 | * 6/1985 | Moore et al. | 123/359 |
| 5,448,492 | * 9/1995 | Kolomyski et al. | . |
| 5,574,632 | * 11/1996 | Pansier | 363/49 |
| 5,712,550 | * 1/1998 | Boll et al. | 318/434 |

FOREIGN PATENT DOCUMENTS

| | | |
|---|---|---|
| 4443351C | 6/1996 | (DE) . |
| 2680007A | 2/1993 | (FR) . |

* cited by examiner

*Primary Examiner*—Kim Huynh
(74) *Attorney, Agent, or Firm*—Michael Best & Friedrich

(57) ABSTRACT

A circuit is provided for testing a drive stage of an actuator, such as a motor of an EPAS system. A power supply circuit comprises a contact for supplying normal drive stage current and a resistor for supplying reduced drive stage current before the normal current is supplied. A measuring circuit measures a drive stage electrical parameter such as supply voltage and a comparator compares this with an acceptable value. If the measured parameter corresponds to a current through the drive stage which is different from an expected value, a fault is signaled and the contact is prevented from closing.

16 Claims, 4 Drawing Sheets

FIG 1  PRIOR ART

☐ = POWER DEVICE

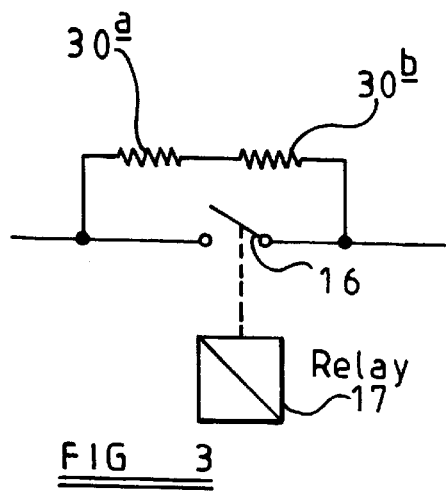
FIG 3
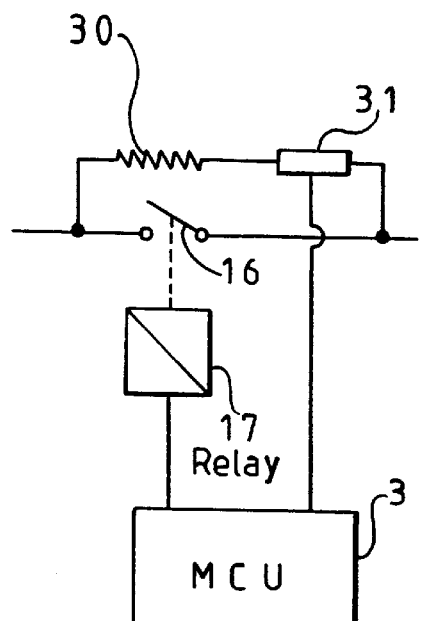
FIG 4
= POWER DEVICE
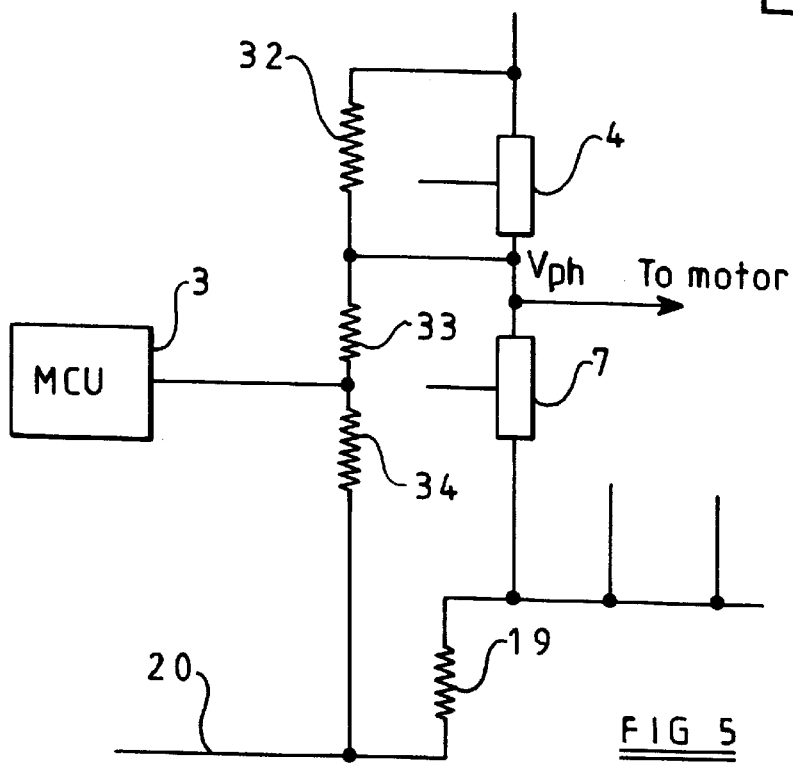
FIG 5
□ = POWER DEVICE

METHOD OF AND CIRCUIT FOR TESTING AN ELECTRICAL ACTUATOR DRIVE STAGE

FILED OF THE INVENTION

The present invention relates to a method of and circuit for testing an electrical actuator power electronic drive stage. Such a circuit may be used for testing a drive stage of a vehicle, for instance for driving an electric motor of an electric power assisted steering (EPAS) system.

BACKGROUND OF THE INVENTION

DE 2 751 116 discloses a testing arrangement for testing vehicle lighting circuits. Constant current sources are switched so as to supply currents depending on the expected load to different lighting circuits. The voltages across the lighting circuits are measured and a fault is indicated if the voltage is higher than a preset expected value. This arrangement therefore detects bulb failure in such lighting circuits.

DE 3 842 921 discloses an arrangement for monitoring the currents drawn by electrical loads. The load current is measured by switching a current sensing resistor into the load circuit and measuring the voltage across the resistor. This voltage is compared with a threshold which indicates whether the load current is acceptable.

DE 4 338 462 discloses a control system for electrical consumers in a motor vehicle. Power is applied to the electrical consumers via a constant current source while switching off the battery voltage for a short time. The voltage across the consumer is monitored and a fault is indicated if it has an unacceptable value during the short time when the constant current source is connected in place of the battery voltage.

SUMMARY OF THE INVENTION

According to a first aspect of the invention, there is provided a circuit for testing an actuator drive stage, comprising a power supply circuit for supplying reduced current to the drive stage before supplying normal current thereto, a measuring circuit for measuring an electrical parameter within the drive stage, and a comparator for comparing the measured parameter with an acceptable value to signal a fault condition when the measured parameter corresponds to a current through the drive stage which is different from an expected value.

Preferably the power supply circuit comprises a contact for supplying the normal current and at least one resistor connected in parallel with the contact for supplying the reduced current before the contact is closed. The resistor may be constructed from two or more discrete components connected in series. A switch may be provided for disconnecting the at least one resistor from the contact.

A controller, such as a microcontroller, may be provided for closing the contact in the absence of a signalled fault condition. The controller may be arranged to switch on at least one active device of the drive stage while the reduced current is supplied to the drive stage.

The controller may be arranged, during supply of the reduced current, to switch on at least part of the drive stage, to switch off the drive stage, and to signal a fault in the actuator if a drive stage output voltage falls below a threshold value in less than a predetermined time period.

The measuring circuit may comprise a circuit for measuring the supply voltage to the drive stage. The measuring circuit may comprise a circuit for measuring an output voltage of the drive stage. The measuring circuit may comprise a potential divider whose output is connected to an analogue-to-digital converter, which may be provided within the controller.

According to a second aspect of the invention, there is provided a method of testing an actuator drive stage, comprising supplying reduced current to the drive stage before supplying normal current thereto, measuring an electrical parameter within the drive stage, signalling a fault condition if the measured parameter corresponds to a current through the drive stage which is different from an expected value, and supplying normal current to the drive stage in the absence of signalling of a fault condition.

It is thus possible to provide an arrangement which signals a fault in an actuator drive stage or in an actuator connected thereto before normal or full power is supplied to the drive stage. It is therefore unnecessary for excessive current, arising for instance from a short circuit in the drive stage or the actuator, to have to be broken, for instance by a contact of an electromagnetic relay, if a fault exists within the drive stage of the actuator. It is further unnecessary to rely on storage of a fault indication detected during previous operation of the actuator.

The invention will be further described, by way of example, with reference to the accompanying drawings, in which:

BRIEF DESCRIPTION OF THE DRAWINGS

FIGS. 3 to 6 are circuit diagrams illustrating possible modifications to the circuit shown in FIG. 2.

Like reference numerals refer to like parts throughout the drawings.

DETAILED DESCRIPTION OF THE PREFERRED EMBODIMENT

Figure 1:
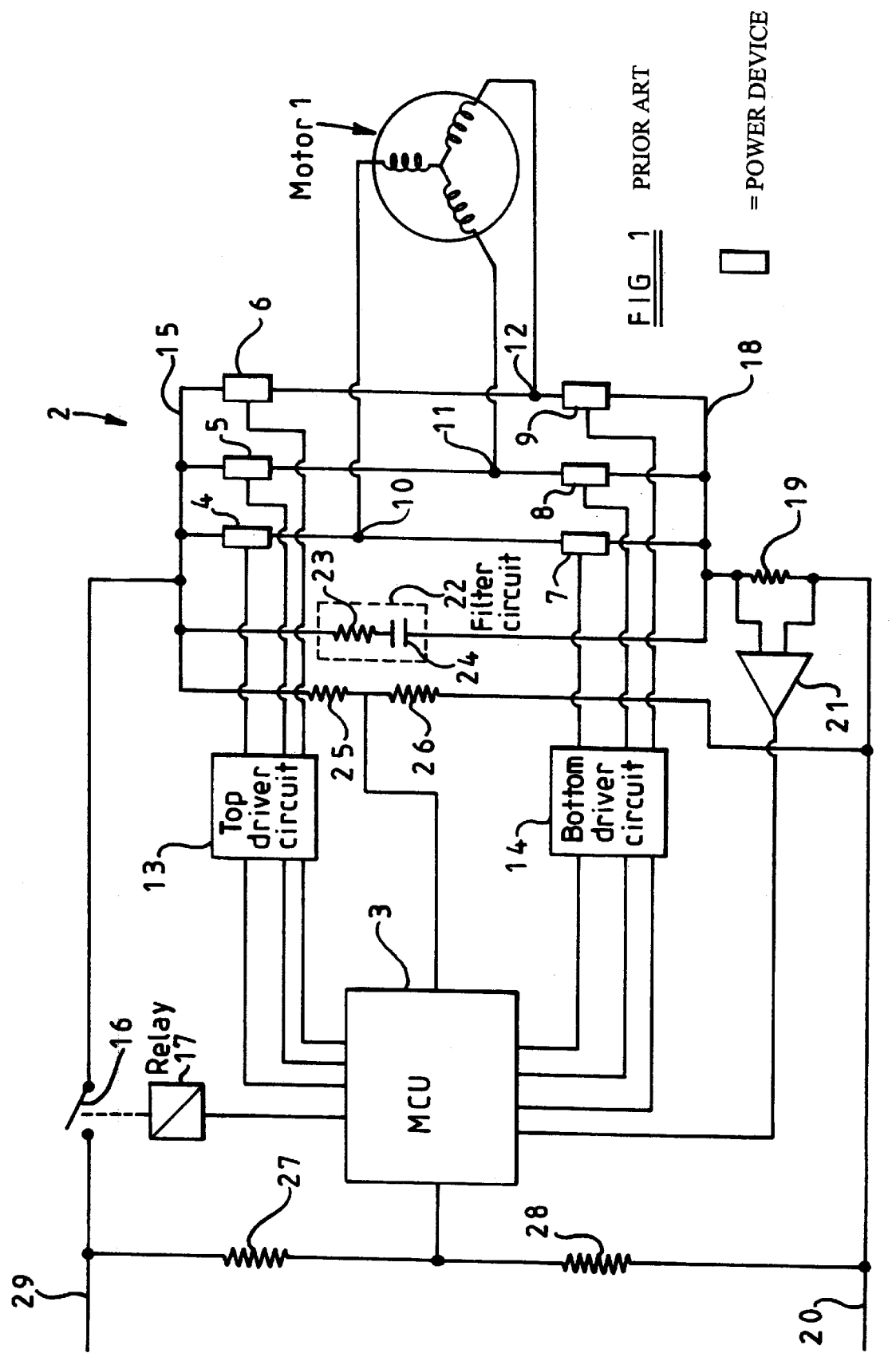
FIG. 1 is a circuit diagram of part of a prior art EPAS system to which the invention may be applied.

FIG. 1 illustrates part of a typical EPAS system for use in a vehicle. A three-phase star-connected brushless permanent magnet motor 1 is connected via a geared drive to a steering column or rack of a vehicle steering system (not shown). The torque applied by a vehicle driver, for instance to a steering wheel, is measured and used to control the current supplied to the motor 1 so as to assist the steering of the vehicle.

The motor 1 is connected to a drive stage 2 for supplying drive current demanded by a microcontroller unit (MCU) 3. The MCU has inputs (not shown) for receiving signals from, for instance, a torque sensor measuring driver torque in the steering system and possibly for receiving signals relating to steering angle, vehicle speed, and other vehicle parameters. The drive stage 2 comprises "top" power devices 4, 5 and 6 and "bottom" power devices 7, 8 and 9 arranged as a three-phase bridge drive circuit with outputs 10, 11 and 12 connected to the three-phase inputs of the motor 1. Each of the power devices 4 to 9 may comprise a power transistor of bipolar or field effect type. The top and bottom power devices are connected to the outputs of top and bottom driver circuits 13 and 14, respectively, whose inputs are connected to outputs of the MCU 3.

A first power supply line 15 of the drive stage 2 is connected via a contact 16 of a relay and a supply line 29 to a vehicle supply, such as a battery. The relay further comprises an electromagnetic coil 17 connected to an output of the MCU 3. A second supply line 18 is connected via a current sensing resistor 19 to a ground connection 20 of the vehicle supply. A differential amplifier 21 has differential inputs connected across the resistor 19 and supplies an output signal to the MCU 3 representing the current through the drive stage 2.

A filter circuit 22 is connected between the power supply lines 15 and 18 of the drive stage 2 for smoothing the current drawn from the vehicle supply. The filter circuit 22 comprises a series-connected resistor 23 and capacitor 24. A potential divider comprising resistors 25 and 26 is connected between the supply lines 15 and 20. The output of the potential divider is connected to an input of the MCU 3. A further potential divider comprising resistors 27 and 28 is connected between ground and the supply line 29. The output of the potential divider is connected to another input of the MCU 3.

The MCU 3 may be powered via a supply line which is switched on by an ignition key of the vehicle or may be constantly powered from the vehicle battery. The MCU 3 contains a microprocessor and associated RAM and ROM, analogue-to-digital converters for converting the outputs of the potential dividers to digital code, and suitable drive arrangements for supplying current demand signals to the driver circuits 13 and 14. The MCU 3 also has an output interface for driving the coil 17 of the electromagnetic relay. The ROM of the MCU 3 stores software for controlling operation of the EPAS system and for performing diagnostic tests.

During normal operation of the EPAS system, when the vehicle electrical system is switched on by the ignition key, the MCU 3 supplies power to the relay 17 so as to close the contact 16. Power is thus supplied to the drive stage 2 via the contact 16. The supply voltage is measured by the MCU 3 by means of the potential divider comprising the resistors 27 and 28 which ensure that the voltage to be measured is within an acceptable range for the MCU 3. Similarly, the voltage across the drive stage supply lines 15 and 20 is measured via the potential divider comprising the resistors 25 and 26 and the current through the drive stage 2 is measured by means of the resistor 19 and the amplifier 21. Diagnostic tests are performed while the vehicle is operating so as to check that the motor 1 is not being incorrectly driven. If a fault is diagnosed, the motor is isolated by turning off the power devices 4 to 9 and removing power from the coil 17 of the relay so as to open the contact 16. Power assistance is therefore disabled so as to protect the vehicle and driver against undesired assistance torques.

Problems may arise at the start of subsequent operation of the vehicle and hence of the EPAS system. If the drive stage 2 has failed with a short circuit, then a large current will flow through the contact 16 when the relay is switched on. This will be detected by the diagnostic tests and the contact 16 will be opened. However, this is undesirable because opening the relay contacts when a large current is flowing can damage the contact 16.

If the fault in the drive stage 2 occurred during previous operation of the system, the MCU 3 may be arranged to store a fault code in non-volatile memory and to recognise this when the system is again switched on so as to prevent closing of the contact 16. However, fault diagnosis is required to err on the side of safety and an incorrect diagnosis may have occurred, in which case the system will remain off when there is no real fault. Further, although the fault diagnosis may have been correct, the non-volatile memory may fail or be incorrectly reset by service personnel, so that the contact 16 may still be required to break a large current and may therefore suffer damage.

Figure 2:
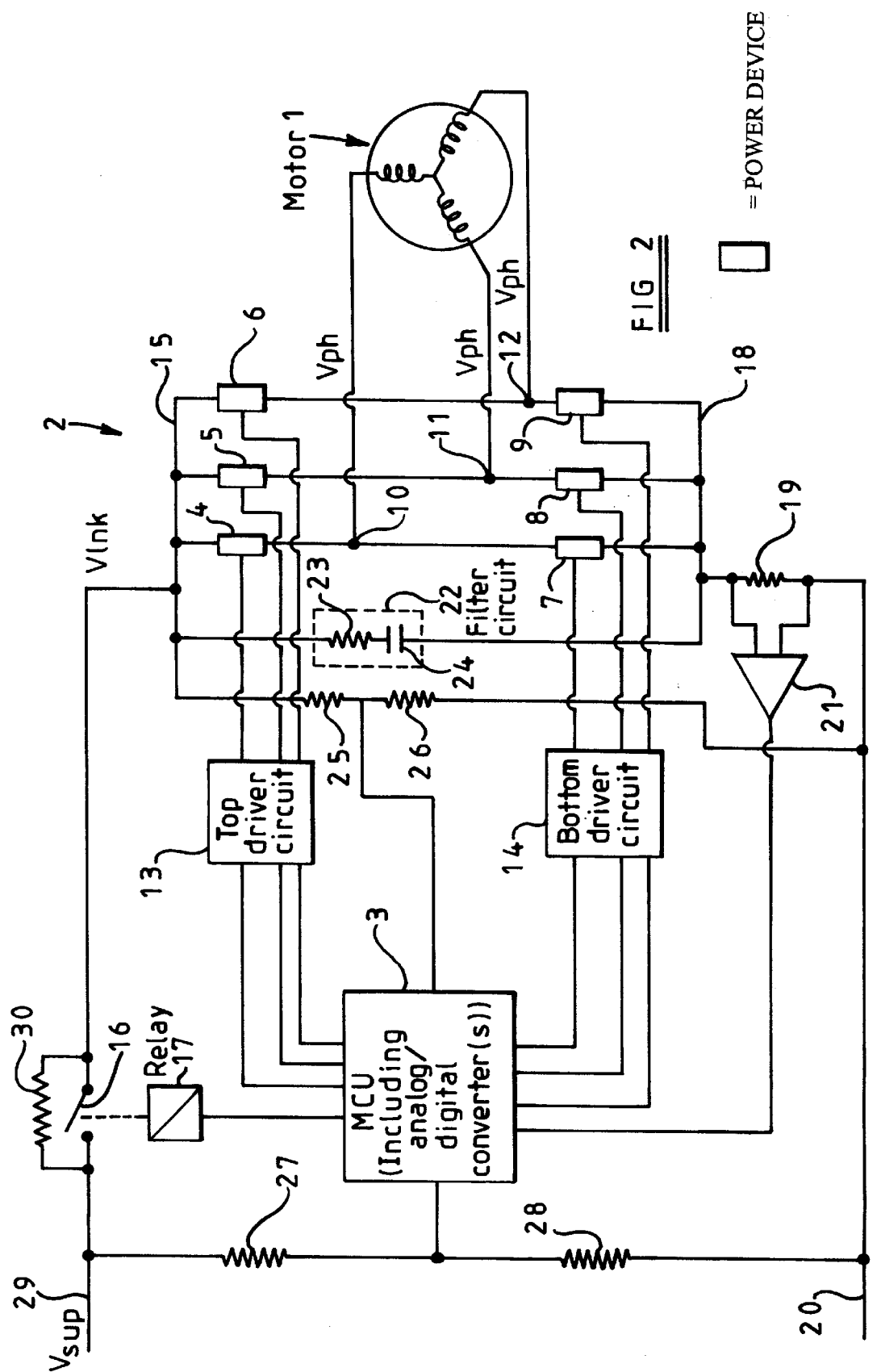
FIG. 2 is a circuit diagram of an EPAS system including a circuit constituting an embodiment of the present invention.

The circuit shown in FIG. 2 overcomes these problems by testing the drive stage 2 for short circuits and other faults at the start of operation of the system before the contact 16 is closed. The circuit shown in FIG. 2 differs from that shown in FIG. 1 in that a resistor 30 is connected in parallel with the relay contact 16 so as to supply reduced current to the output stage 2 during initial diagnostic tests. Such tests are made when the system has been activated before the start of a journey but before the relay contact 16 has been closed. It is also possible for the tests to be performed at the end of the journey and the results stored in non-volatile memory.

FIG. 3 illustrates a possible modification according to which the resistor 30 is replaced by series-connected resistors 30a and 30b. This minimises the risk of a failed resistor 30 short-circuiting the contact 16.

FIG. 4 illustrates another possible modification according to which the resistor 30 is connected in series with a switching device 31, such as a bipolar or field effect transistor, controlled by the MCU 3. This arrangement allows the resistor 30 to be disconnected so that other tests on operation of the relay may be performed. For instance, such tests may include a check on the relay switching time.

FIG. 5 illustrates another variation which allows the individual phase or output voltages of the drive stage 2 to be measured. For the purpose of illustration, only one limb of the bridge drive stage has been shown comprising the power devices 4 and 7.

A resistor 32 is connected across the power device 4 whereas a potential divider comprising resistors 33 and 34 is connected across the power device 7 and sense resistor 19. The output of the potential divider is connected to an input of the MCU 3. The resistor network 32–34 is used to bias this phase voltage around the centre and the potential divider reduces the voltage to a suitable level for an analogue-to-digital converter within the MCU 3.

Figure 6:
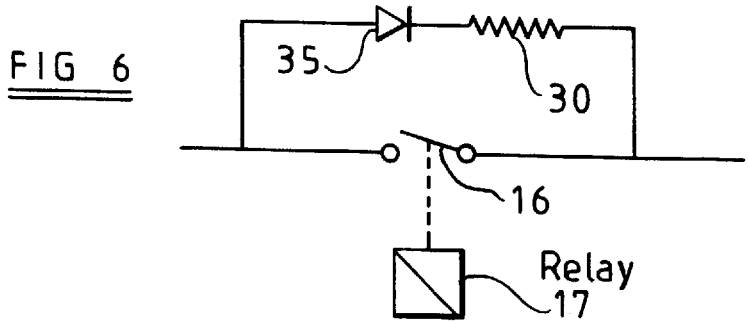

In order to prevent current passing to the drive stage 2 if the supply voltage polarity is erroneously reversed, a diode 35 may be connected in series with the resistor 30 or the resistors 30a and 30b as shown in FIG. 6. Power supply to the MCU 3 is separately protected. Thus, even if the MCU 3 were able to be powered, the supply voltage at the supply line 29 will be found to be outside the normal limits when monitored by the MCU 3 so that the contact 16 will not be closed.

The diagnostic tests which are made before the contacts are closed depend on the measurements that are available. There are a number of different possible combinations of tests comprising alternative configurations of the following measurements:

1. supply voltage measurements across the lines 29 and 20;
2. drive stage supply voltage measurements across the lines 15 and 20;
3. motor phase voltage measurements across the lines 10 and 20, 11 and 20, and 12 and 20;
4. supply filter network oscillation measurement;

The diagnostics that can be performed with each measurement are described below. All of the diagnostics except the filter network oscillation are based on the following sequence of operations:

a) wait for any transients to settle then check that the measured voltages are within normal limits with all of the power devices turned off and the relay 16, 17 turned off;

b) turn on each top power device 4, 5, 6 one at a time, wait for any transients to settle and then check that the measured voltages are within normal limits;

c) turn off the top devices 4, 5, 6 and then turn on each bottom power device 7, 8, 9 one at a time and check that the measured voltages are within normal limits (after waiting for any transients to settle);

d) turn on each top and bottom pair 4+7, 5+8, 6+9, one at a time to get direct (shoot-through) paths, wait for transient fluctuations to settle and then check that the measured voltages are within limits.

It is possible to go through the full test sequence and record the results to provide a clear indication of any of the failure modes that may have occurred. It is better to stop the tests as soon as any failure mode is revealed. In either case, if a failure mode is discovered, the system should be returned to the safest possible state by turning off all of the power devices and inhibiting operation of the relay 16, 17.

In the tables below, $V_{Ink}$ is the measured drive stage voltage between the lines 15 and 20, $V_{ph}$ is any measured phase output voltage, $V_{sup}$ is the measured supply voltage, s/c is shorthand for short circuit, o/c is shorthand for open circuit.

Diagnostics with Drive Stage Voltage Measurement (Using Resistors 25, 26)

| Test | Normal result | Abnorml result | Possible causes |
|---|---|---|---|
| All power devices off | $V_{Ink}$ high | $V_{Ink}$ low | Motor supply link s/c to ground<br>Motor supply link o/c<br>$V_{Ink}$ measurement top resistor o/c<br>$V_{Ink}$ measurement bottom resistor s/c<br>At least one top and one bottom power device s/c |
| Single top power device on | $V_{Ink}$ high | $V_{Ink}$ low | Motor star point s/c to ground<br>Bottom power device s/c<br>$V_{Ink}$ measurement top resistor o/c<br>$V_{Ink}$ measurement bottom resistor s/c |
| Single bottom power device on | $V_{Ink}$ high | $V_{Ink}$ low | Top power device s/c<br>$V_{Ink}$ measurement top resistor o/c<br>$V_{Ink}$ measurement bottom resistor s/c |
| Single top & bottom pair on | $V_{Ink}$ low | $V_{Ink}$ high | Cround link o/c<br>Top power device o/c<br>Bottom power device o/c |

Diagnostics with Phase Voltage Measurement (Using Resistors 32–34)

| Test | Normal result | Abnormal result | Possible causes |
|---|---|---|---|
| All devices off | $V_{ph}$ centred | $V_{ph}$ pulled high | Ground link o/c<br>Motor phase s/c to supply<br>Motor star point s/c to supply<br>Top device s/c |
| | | $V_{ph}$ pulled low | Motor supply link s/c to ground<br>Motor supply link o/c<br>Motor phase s/c to ground<br>Motor star point s/c to ground<br>Bottom device s/c |
| Single top device on | All $V_{ph}$ pulled high | all $V_{ph}$ centred | Top device o/c |
| | | some $V_{ph}$ centred<br>$V_{ph}$ pulled low | Motor phase o/c<br>Motor supply link s/c to ground<br>Motor suppiy link o/c |

| Test | Normal result | Abnormal result | Possible causes |
|---|---|---|---|
| Single bottom device on | $V_{ph}$ pulled low | all $V_{ph}$ centred | Motor phase s/c to ground<br>Motor star point s/c ground<br>Bottom device o/c |
| | | some $V_{ph}$ centred<br>$V_{ph}$ pulled high | Motor phase o/c<br>Ground link o/c |

It is also possible to recognise faults in the phase voltage measurement divider network and the connections to the power devices.

Diagnostics with Link Voltage Measurement and Supply Voltage Measurement

| Test | Normal result | Abnormal result | Possible causes |
|---|---|---|---|
| All devices off | $V_{Ink}$ less than $V_{sup}$ | $V_{Ink}$ nearly equal to $V_{sup}$ | Relay contacts closed or s/c |

Once the charge in the capacitor 24 has settled, the voltage drop across the contact 16 is determined by the potential divider comprising the resistor 30 and the measuring resistor network such as the resistors 25 and 26 or the resistors 32 to 34. If the difference between the measured drive stage voltage $V_{Ink}$ and the measured supply voltage $V_{sup}$ is too small, a short circuit fault on the relay 17 such that the contact 16 is unexpectedly closed can be diagnosed before the system is made operational. Normal operation can then be inhibited and a warning issued. However, there are two specific situations in which this test might give an erroneous result as follows.

If the supply voltage has not been connected to the line 29 for a sufficient time, then the capacitor 24 will not be fully charged to its usual pre-operation state. This might arise if, for instance, a mechanic has just reconnected the vehicle battery. If the contact 16 were closed in this state, a relatively large current would flow into the capacitor 24 which might damage the contact 16. However, this state can be detected by the rapid fall in the voltage drop from an anomalously high starting value and closure of the contact 16 can be delayed until the voltage drop has fallen low enough.

If the driver has just switched on the ignition after a brief switch-off interval, then the capacitor 24 may still be charged almost to the supply voltage. This can be detected by starting a timer when the driver switches off the ignition. if the driver switches the ignition on again after only a brief interval, then no diagnosis of a shorted relay contact can be made.

Diagnostics with Link Voltage Measurement and Filter Network Oscillation

The above diagnostics are unable to detect a short-circuited motor winding. Because the motor winding resistance is small, a large current is needed to obtain a measurable voltage drop. Therefore it is hard to measure the motor winding resistance with the small current that flows through the resistor 30 during the diagnostic tests.

Instead of measuring the resistance, it is possible to measure the effect of the inductance of the motor winding using energy stored in the filter network 22. The operations required are:

(i) charge up the filter capacitor 24 via the resistors 23 and 30;

(ii) turn on one top device 4 and one bottom device 8 simultaneously to draw current through the motor 1;

(iii) wait for the time it takes the voltage in a short-circuited winding to fall to zero;

(iv) measure the drive stage supply $V_{Ink}$ and/or phase voltages $V_{ph}$;

(v) repeat steps (i) to (iv) for each path through the motor 1;

(vi) if any voltage measured in step (iii) is near to zero, then the diagnostic test indicates a short-circuited winding and the relay contact 16 should not be closed.

If the motor winding inductance is present, then the inductance will oppose the capacitor discharge and so the drive stage supply $V_{Ink}$ and phase voltages $V_{ph}$ will still be close to the supply voltage $V_{sup}$ after the time it takes for a short-circuited winding to decay to zero.

Figure 7:
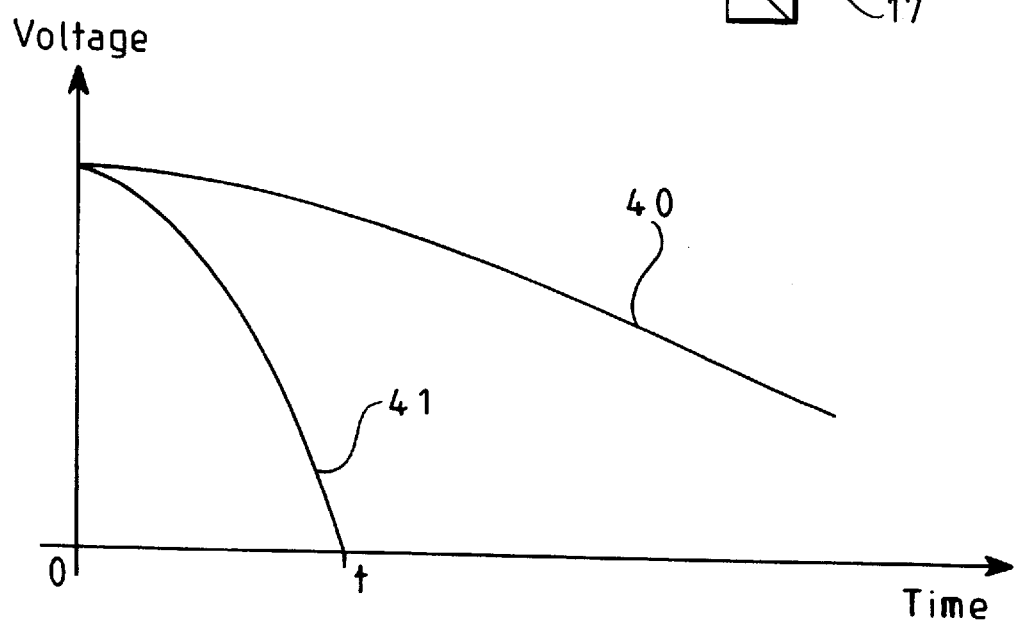
FIG. 7 is a graph of voltage against time illustrating a test which may be performed by th e circuit shown in FIG. 1.

This diagnostic test is illustrated in FIG. 7, which illustrates the decay of the voltage across a normal motor winding by curve 40 and the decay across a short-circuited winding by the curve 41. In the case of a short circuited winding, the voltage decays to zero in a time t whereas the voltage across a normal winding decays much more slowly. Thus, by measuring the drive stage supply voltage or the phase voltage after an appropriate time delay following the step (ii), the measured voltage provides an indication of whether the winding is short-circuited. Alternatively, the time taken for the voltage to fall to zero or near to zero may be measured to assess whether the winding is short-circuited.

Prior to measurement of the effect of the motor inductance, correct operation of the filter circuit 22 may be diagnosed as follows. The MCU 3 switches a load between the supply lines 15 and 18 that will tend to discharge the capacitor 24. For instance, such a load may be the coil of a solenoid operated clutch, the coil of another relay, or a resistor. An excessive rate of rise of the voltage difference between the drive stage supply voltage $V_{Ink}$ and the supply voltage $V_{sup}$ (i.e. the voltage drop across the resistor 30) indicates too little capacitance in the reservoir capacitor 24 or an excessive load. Too small a rate of rise indicates too much capacitance or insufficient loading. If this diagnostic test is performed satisfactorily so as to imply that the capacitance of the capacitor 24 is correct, then the effect of the motor inductance may be measured as described hereinbefore.

The forward voltage drop of the diode 35 (when present) and the time constant of the capacitor 24 and the quiescent loading network comprising the resistors 25, 26, 32, 33 and 34 can be deducted from measurement of the voltage drop $(V_{sup} - V_{Ink})$ across the resistor 30 during the recovery phase as follows.

The MCU 3 switches off the load as soon as the voltage drop rises above (VD1+VD1 margin) where, for example, VD1=3 volts and VD1 margin=0.2 volts. As soon as the voltage drop falls below VD1, a timer is started. The timer values TD2 and TD3 are stored when the voltage drop falls below VD2 and VD3, respectively, where, for example, VD2=2.37 volts and VD3=1.74 volts.

The following equations can then be us ed to estimate the forward voltages drop Vf of the diode and the time constant TC of the capacitor 24 and resistors:

$$TC = \frac{[(TD2)(VD1-VD3)(TD3-TD2)]}{2[TD3(VD1-VD2)-TD2(VD1-VD3)]}$$

-continued $$\text{Aiming voltage drop } AVD = \frac{TC(VD2-VD1)}{TD2} + \frac{VD2+VD1}{2}$$

$Vf = AVD - BF \ (V_{sup} - AVD)$ where BF is a biasing factor equal to the resistance of the resistor 30 divided by the total load due to the resistors 25, 26, 32–34 which pull down the drive stage supply voltage $V_{Ink}$.

What is claimed is:

1. A circuit for testing an actuator and drive stage thereof comprising a controller for selectively coupling a drive current to energize the actuator in drive state and a reduced current to per form diagnostic test on the actuator and the drive stage to an input to the actuator and drive stage through which current is supplied to the actuator, and for switching on at least part of the actuator and drive stage during supply of the reduced current, and a measuring circuit for measuring an electrical parameter within the actuator and drive stage, wherein the controller includes a comparator for comparing the measured electrical parameter with a predetermined value which corresponds to a current characteristic of the actuator and drive stage to signal a fault condition when the electrical parameter is different from the predetermined value.

2. A circuit as claimed in claim 1, wherein the at least part of the actuator and drive stage is an active component thereof.

3. A circuit as claimed in claim 1, wherein the measuring circuit is operative for measuring an output voltage of the actuator and drive stage.

4. A circuit as claimed in claim 3, wherein said measuring circuit comprises a potential divider having an output connected to an analog-to-digital converter.

5. A circuit as claimed in claim 3, wherein the controller is arranged to switch on and subsequently switch off the reduced current to the at least part of the actuator and drive stage and for signaling an actuator fault if the output voltage falls below a threshold value in less than a predetermined time period.

6. A circuit as claimed in claim 1, wherein the controller is arranged, when the reduced current is supplied to the actuator and drive stage, to connect and subsequently disconnect a load across a power supply filter of the actuator and drive stage, the measuring circuit being operative for measuring a supply voltage to the actuator and drive stage and for signaling a filter fault if a characteristic of the measured drive stage supply voltage against time differs from a predetermined characteristic.

7. A circuit as claimed in claim 1, wherein said drive current is supplied from a power supply when a contact is closed and said reduced current is supplied from said power supply when said contact is open through at least one resistor in parallel with said contact.

8. A circuit as claimed in claim 7, wherein the controller provides a signal for closing the contact in the absence of the fault condition thereby to couple the drive current to the actuator and drive stage.

9. A circuit as claimed in claim 7 and further comprising a switch coupled in a series circuit relationship to the at least one resistor and for disconnecting the at least one resistor from the power supply.

10. A method of testing an actuator and drive stage, the method comprising:

coupling a power supply to an input to the actuator and drive stage, through which current is supplied to the actuator, to supply a reduced current relative to a drive current of the actuator and drive stage; wherein the drive current is to energize the actuator in drive stage and the reduced current is to perform diagnostic test on the actuator and the drive stage;

switching on at least part of the actuator and drive stage while the reduced current is supplied thereto;

measuring an electrical parameter within the at least part of the actuator and drive stage;

signaling a fault condition when the electrical parameter is different from a predetermined value which corresponds to a current characteristic of the actuator and drive stage; and coupling the power supply to the input to supply the drive current to the actuator and drive stage in the absence of the fault condition.

11. A circuit for testing an actuator drive stage, the circuit comprising:

a controller for selectively coupling a drive current and a reduced current to the actuator drive stage and for switching on at least part of the actuator drive stage during supply of the reduced current; wherein the drive current is to energize the actuator in drive stage and the reduced current is to perform diagnostic test on the actuator and the drive stage;

a measuring circuit for measuring an electrical parameter within the actuator drive stage; and a comparator for comparing the measured electrical parameter with a predetermined value which corresponds to a current characteristic of the actuator drive stage to signal a fault condition when the measured electrical parameter is different from the predetermined value;

wherein the controller is arranged, when the reduced current is supplied to the actuator drive stage, to connect and subsequently disconnect a load across a power supply filter of the actuator drive stage, the measuring circuit being operative for measuring a supply voltage to the actuator drive stage and for signaling a filter fault if a characteristic of the measured drive stage supply voltage against time differs from a predetermined characteristic.

12. A circuit as claimed in claim 11 wherein the drive current is supplied from a power supply when a contact is closed and the reduced current is supplied from the power supply when the contact is open through at least one resistor in parallel with the contact.

13. A circuit as claimed in claim 12 wherein the controller provides a signal for closing the contact in the absence of the fault condition thereby to couple the drive current to the actuator drive stage.

14. A circuit as claimed in claim 12 and further comprising a switch coupled in a series circuit relationship to the at least one resistor and for disconnecting the at least one resistor from the power supply.

15. A circuit for testing an element in an actuator and drive stage combination, the circuit comprising:

a controller for selectively coupling a drive current and a test current to an input to the actuator and drive stage combination through which current is supplied to the actuator, the test current having a lower magnitude than the drive current and insufficient to drive the actuator, the controller applying the test current to the combination before the drive current;

a measuring circuit for measuring, during supply of the test current to the actuator and drive stage combination, an electrical parameter that corresponds to a current characteristic of a part of the actuator and drive stage combination;

a storage device coupled to the measuring circuit and for storing a predetermined value of the electrical parameter; and a comparator for comparing the measured electrical parameter with the predetermined value and for signaling a fault condition when the measured electrical parameter is different from the predetermined value.

16. A circuit for testing an element in an actuator and drive stage combination, the circuit comprising:

a current divider having a current-limiting, test current branch and a drive current branch coupled in parallel to the current-limiting, test current branch, the drive current branch having a switch;

a controller coupled to the switch and for selectively coupling a drive current and a test current to an input to the actuator and drive stage combination through which current is supplied to the actuator, the test current having a lower magnitude than the drive current that is insufficient to drive the actuator, the controller applying the test current to the combination before applying the drive current, the controller having a storage device and a comparator module;

a measuring circuit for measuring, during supply of the test current to the actuator and drive stage combination, an electrical parameter that corresponds to a current characteristic of a part of the actuator and drive stage combination;

the storage device coupled to the measuring circuit and for storing a predetermined value of the electrical parameter; and the comparator module for comparing the measured electrical parameter with the predetermined value and for signaling a fault condition when the measured electrical parameter is different from the predetermined value.

* * * * *

UNITED STATES PATENT AND TRADEMARK OFFICE
CERTIFICATE OF CORRECTION

PATENT NO. : 6,330,140 B1
DATED : December 11, 2001
INVENTOR(S) : Wilson-Jones et al.

It is certified that error appears in the above-identified patent and that said Letters Patent is hereby corrected as shown below:

Column 8,
Line 15, delete "in" and insert -- and --.
Line 15, delete "state" and insert -- stage --.
Line 16, delete "per form" and insert -- perform --.
Line 16, delete "test" and insert -- tests --.
Line 16, after the word "and" delete "the".

Column 9,
Lines 2 and 23, delete ";".
Lines 3 and 24, delete "in" and insert -- and --.
Lines 4 and 25, delete "test" and insert -- tests --.
Line 5, after the word "and" delete "the".
Line 26, delete "the".

Signed and Sealed this

Thirtieth Day of April, 2002

Attest:

Attesting Officer

JAMES E. ROGAN
Director of the United States Patent and Trademark Office